United States Patent
Enya et al.

(10) Patent No.: US 8,173,458 B2
(45) Date of Patent: May 8, 2012

(54) METHOD FOR FORMING QUANTUM WELL STRUCTURE AND METHOD FOR MANUFACTURING SEMICONDUCTOR LIGHT EMITTING ELEMENT

(75) Inventors: Yohei Enya, Itami (JP); Yusuke Yoshizumi, Itami (JP); Masaki Ueno, Itami (JP); Fumitake Nakanishi, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 12/417,857

(22) Filed: Apr. 3, 2009

(65) Prior Publication Data

US 2009/0258452 A1    Oct. 15, 2009

(30) Foreign Application Priority Data

Apr. 9, 2008   (JP) .................................. 2008-101781

(51) Int. Cl.
*H01L 21/00*   (2006.01)

(52) U.S. Cl. ............... 438/31; 438/29; 438/34; 438/35; 438/46; 438/47; 438/492; 438/503; 438/507

(58) Field of Classification Search ............... 438/29, 438/31, 34–35, 46–47, 492, 503, 507
See application file for complete search history.

(56) References Cited

U.S. PATENT DOCUMENTS

| | | | |
|---|---|---|---|
| 6,542,526 B1 | 4/2003 | Niwa et al. | |
| 6,940,100 B2 * | 9/2005 | Tsujimura et al. | 257/98 |
| 7,456,034 B2 * | 11/2008 | Ikedo et al. | 438/22 |
| 7,482,635 B2 * | 1/2009 | Kobayakawa et al. | 257/96 |
| 2003/0001238 A1 * | 1/2003 | Ban | 257/627 |
| 2003/0059971 A1 | 3/2003 | Chua et al. | |
| 2003/0183827 A1 * | 10/2003 | Kawaguchi et al. | 257/79 |
| 2005/0170537 A1 * | 8/2005 | Hooper et al. | 438/22 |
| 2005/0224783 A1 * | 10/2005 | Matsuyama et al. | 257/14 |

(Continued)

FOREIGN PATENT DOCUMENTS

JP    2001-192828    7/2001

(Continued)

OTHER PUBLICATIONS

Shi-Jong Leem, Min Hong Kim, Johngeon Shin, Yoonho Choi and Jichai Jeong, "The effects of in Flow during Growth Interruption on the Optical Properties of InGaN Multiple Quantum Wells Grown by Low Pressure Metalorganic Chemical Vapor Deposition," Jpn. J. App. Phys., Apr. 15, 2001, Japan vol. 40, pp. L371-L373.

Ishizuka et al: "Optical properties of GaInNAs quantum wells on misoriented substrates grown by MOVPE", Journal of Crystal Growth, Elsevier, Amsterdam, NL, vol. 298, pp. 116-120, 2007.

(Continued)

*Primary Examiner* — Bac Au
(74) *Attorney, Agent, or Firm* — Venable LLP; Michael A. Sartori; Michael E. Nelson

(57) ABSTRACT

A method for forming a quantum well structure that can reduce the variation in the In composition in the thickness direction of a well layer and a method for manufacturing a semiconductor light emitting element are provided. In a step of forming a quantum well structure (active layer) by alternately growing barrier layers and well layers on a primary surface of a GaN substrate, the well layers are each formed by growing InGaN, the barrier layers are each grown at a first temperature, the well layers are each grown at a second temperature which is lower than that of the first temperature, and when the well layers are each formed, before a starting material gas for Ga (trimethylgallium) is supplied, a starting material gas for In is supplied.

20 Claims, 13 Drawing Sheets

U.S. PATENT DOCUMENTS

| | | | |
|---|---|---|---|
| 2007/0063215 A1 | 3/2007 | Kohda | |
| 2007/0218703 A1* | 9/2007 | Kaeding et al. | 438/775 |
| 2007/0284588 A1* | 12/2007 | Kinoshita | 257/79 |
| 2007/0284599 A1* | 12/2007 | Sakai | 257/94 |
| 2008/0113497 A1* | 5/2008 | Tachibana et al. | 438/483 |
| 2009/0200538 A1* | 8/2009 | Sasaki et al. | 257/14 |

FOREIGN PATENT DOCUMENTS

| | | |
|---|---|---|
| JP | 2002-344089 | 11/2002 |
| JP | 2003-273470 A | 9/2003 |
| WO | WO-2006/109840 A1 | 10/2006 |

OTHER PUBLICATIONS

Liu et al., "Effects of TMIn flow on the interface and optical properties of InGaN/GaN multiple quantum wells", Journal of Crystal Growth, Elsevier, vol. 264, pp. 53-57 (2004).

Senthil et al., "Improved Internal Quantum Efficiency of Green Emitting InGaN/GaN Multiple Quantum Wells by in Preflow for InGaN Well Growth", Japanese Journal of Applied Physics, vol. 47, No. 2, pp. 839-842 (2008).

* cited by examiner

METHOD FOR FORMING QUANTUM WELL STRUCTURE AND METHOD FOR MANUFACTURING SEMICONDUCTOR LIGHT EMITTING ELEMENT

BACKGROUND OF THE INVENTION

1. Field of the Invention

The present invention relates to a method for forming a quantum well structure and a method for manufacturing a semiconductor light emitting element.

2. Description of the Related Art

In recent years, some type of group III nitride-based semiconductor light emitting element includes an active layer having a multiquantum well (MQW) structure in which well layers each composed of a group III nitride semiconductor which includes indium (hereinafter referred as "In" in some cases) and another group III element (such as gallium) and barrier layers each composed of GaN or InGaN which has a band gap wider than that of each well layer are alternately laminated to each other. In the MQW structure as described above, when the well layer is grown on the barrier layer, a starting material gas for In (such as trimethylindium), a starting material gas for the other group III element (such as trimethylgallium), and a starting material gas for N (such as ammonia) are simultaneously supplied to a growth furnace so as to epitaxially grow a group III nitride semiconductor crystal.

As a related technique, in Japanese Unexamined Patent Application Publication No. 2001-192828, a pre-flow operation has been disclosed in which when a predetermined film is formed on a surface of a workpiece using a high melting point metal compound gas and a reducing gas, one of the high melting point metal compound gas and the reducing gas is supplied before the other gas is supplied. In addition, in "Effects of TMIn flow on the interface and optical properties of InGaN/GaN multiquantum wells", by J. P. Liu et al., Journal of Crystal Growth, ELSEVIER, Volume 264, pp. 53 to 57 (2004), a technique has been disclosed in which a multiquantum well structure including InGaN well layers and GaN barrier layers is formed by a metal organic chemical vapor deposition (MOCVD) method on a GaN layer which has the (0001) plane as a growth surface and which is formed on a sapphire substrate. According to the this document, before an InGaN well layer is grown which has a photoluminescence (PL) wavelength in a blue-violet range in the vicinity of a wavelength of 405 nm, pre-flow of trimethylindium is performed for a predetermined time.

SUMMARY OF THE INVENTION

Since the band gap of the well layer needs to be narrower than that of the barrier layer, in general, an In composition of the well layer is set higher than that of the barrier layer. In addition, the variation in the In composition of the well layer in a thickness direction thereof is preferably reduced as small as possible. The reason for this is that when the variation in the In composition in the thickness direction of the well layer is reduced, the band gap value becomes stable along the thickness direction, and the spread of light emission wavelength (half bandwidth of a light emission spectrum) can be suppressed.

However, through research carried out by the inventors of the present invention, it was found that, due to the difference in lattice constant between the barrier layer and the well layer, the In composition is insufficient at an early growth stage of the well layer. That is, immediately after the well layer (such as InGaN) starts to grow, In is not sufficiently incorporated right on the barrier layer (such as GaN), and the In composition gradually increases as the well layer grows; hence, a desired In composition is realized when the thickness of the well layer reaches a certain level. Accordingly, the variation in the In composition unfavorably occurs in the thickness direction of the well layer, and as a result, it becomes difficult to suppress the spread of light emission wavelength.

In particular, when the light emission wavelength of the well layer is set from a green to a red color wavelength range, such as from 450 nm to 650 nm, a gallium nitride substrate having a primary surface inclined with the (0001) plane is used; however, when the well layer is formed on a gallium nitride substrate having an off-angle as described above, In is not easily incorporated as compared to the growth on the (0001) plane, and as a result, the variation in the In composition apparently occurs in the thickness direction of the well layer.

In addition, according to the technique disclosed in the above non-patent document written by J. P. Liu et al., it is believed that since the PL wavelength of the InGaN well layer is in a blue-violet range in the vicinity of a wavelength of 405 nm, the In composition of the well layer is relatively low. In the case as described above, the variation in the In composition in the thickness direction will rarely cause problems. In addition, also in the case as described above, in general, a growth temperature of the well layer and that of the barrier layer are set to be equal to each other. However, when it is attempted to obtain a higher In composition by decreasing the growth temperature of the well layer lower than that of the barrier layer, the above problem caused by the variation in the In composition in the thickness direction becomes apparent.

The present invention has been conceived in consideration of the above problem, and an object of the present invention is to provide a method for forming a quantum well layer structure that can reduce the variation in the In composition in a thickness direction of a well layer grown on a gallium nitride substrate having an off-angle and to provide a method for manufacturing a semiconductor light emitting element.

In order to solve the problem described above, a method for forming a quantum well structure according to the present invention, comprises the step of alternately growing barrier layers and well layers on a primary surface of a gallium nitride substrate which is inclined with respect to the (0001) plane so as to form the quantum well structure, and in the above growing step, the well layers are each formed by growing a group III nitride semiconductor including indium and another group III element, the barrier layers are each grown at a first temperature, the well layers are each grown at a second temperature which is lower than the first temperature, and when the well layers are each grown, a starting material gas for indium is supplied before a starting material gas for the other group III element is supplied.

In addition, a method for manufacturing a semiconductor light emitting element according to the present invention is a method for manufacturing a semiconductor light emitting element having a light emission wavelength of 450 to 650 nm, which comprises the step of alternately growing barrier layers and well layers on a primary surface of a gallium nitride substrate which is inclined with respect to the (0001) plane so as to form a quantum well active layer. In the above growing step, the well layers are each formed by growing a group III nitride semiconductor including indium and another group III element, the barrier layers are each grown at a first temperature, the well layers are each grown at a second temperature which is lower than the first temperature, and when the well layers are each grown, a starting material gas for indium is supplied before a starting material gas for the other group III element is supplied.

In the above method for forming a quantum well structure and method for manufacturing a semiconductor light emitting element, when the well layers are each grown, before the starting material gas for the other group III element is supplied, the starting material gas for In is supplied. Accordingly, until the starting material gas for the other group III element is supplied, In atoms are migrating on each barrier layer. Subsequently, since the well layer is continuously grown by starting the supply of the starting material gas for the other group III element, the In atoms migrating at an early growth stage are incorporated in the well layer, and a decrease in the In composition at the early growth stage of the well layer is suppressed; hence, the variation in the In composition in the thickness direction of the well layer formed on the primary surface of the gallium nitride substrate which is inclined with respect to the (0001) plane can be reduced. In addition, when the In composition is increased by decreasing the growth temperature (second temperature) of the well layer lower than the growth temperature (first temperature) of the barrier layer, the variation in the In composition in the thickness direction can be particularly effectively reduced; hence, a well layer having a relatively long PL wavelength, such as in the range of 450 to 650 nm, can be preferably formed.

In addition, in the above method for forming a quantum well structure and method for manufacturing a semiconductor light emitting element, before the starting material gas for the other group III element is supplied, a starting material gas for nitrogen may be supplied together with the starting material gas for indium. In this case, from the start of supplying the starting material gas for indium and the starting material gas for nitrogen to the start of supplying the starting material gas for the other group III element, In atoms and InN molecules are migrating on each barrier layer. Even by the method as described above, the decrease in the In composition at the early growth stage of the well layer can be suppressed.

In addition, in the above method for forming a quantum well structure and method for manufacturing a semiconductor light emitting element, when the well layers are each grown, the supply of the starting material gas for indium may be started after a substrate temperature reaches the second temperature. Accordingly, In atoms are effectively migrating on the barrier layer at the early growth stage of the well layer, and the effect described above can be preferably obtained.

In addition, in the above method for forming a quantum well structure and method for manufacturing a semiconductor light emitting element, the other group III element may include gallium. That is, when the well layers are each formed by growing InGaN, since the supply of the starting material gas for Ga is started after a predetermined time from the start of supplying the starting material gas for In and the starting material gas for nitrogen, the variation in the In composition in the thickness direction of the well layer can be effectively reduced.

In addition, in the above method for forming a quantum well structure and method for manufacturing a semiconductor light emitting element, the starting material gas for indium may include trimethylindium (TMI), and the starting material gas for gallium may include trimethylgallium (TMG). That is, since TMI is supplied before TMG is supplied, the variation in the In composition in the thickness direction of the well layer can be effectively reduced.

In addition, in the above method for forming a quantum well structure and method for manufacturing a semiconductor light emitting element, the In composition of each of the well layers may be 15% or more. When the well layers are each grown so as to have a relatively high In composition, a well layer having a large thickness must be grown in the past in order to obtain a desired In composition. However, according to the methods described above, even when a well layer having a relatively high In composition is grown, a desired In composition can be obtained even at a smaller thickness of the well layer.

According to the method for forming a quantum well structure and method for manufacturing a semiconductor light emitting element of the present invention, the variation in the In composition in the thickness direction of the well layer can be reduced.

Figures 6A, 6B:
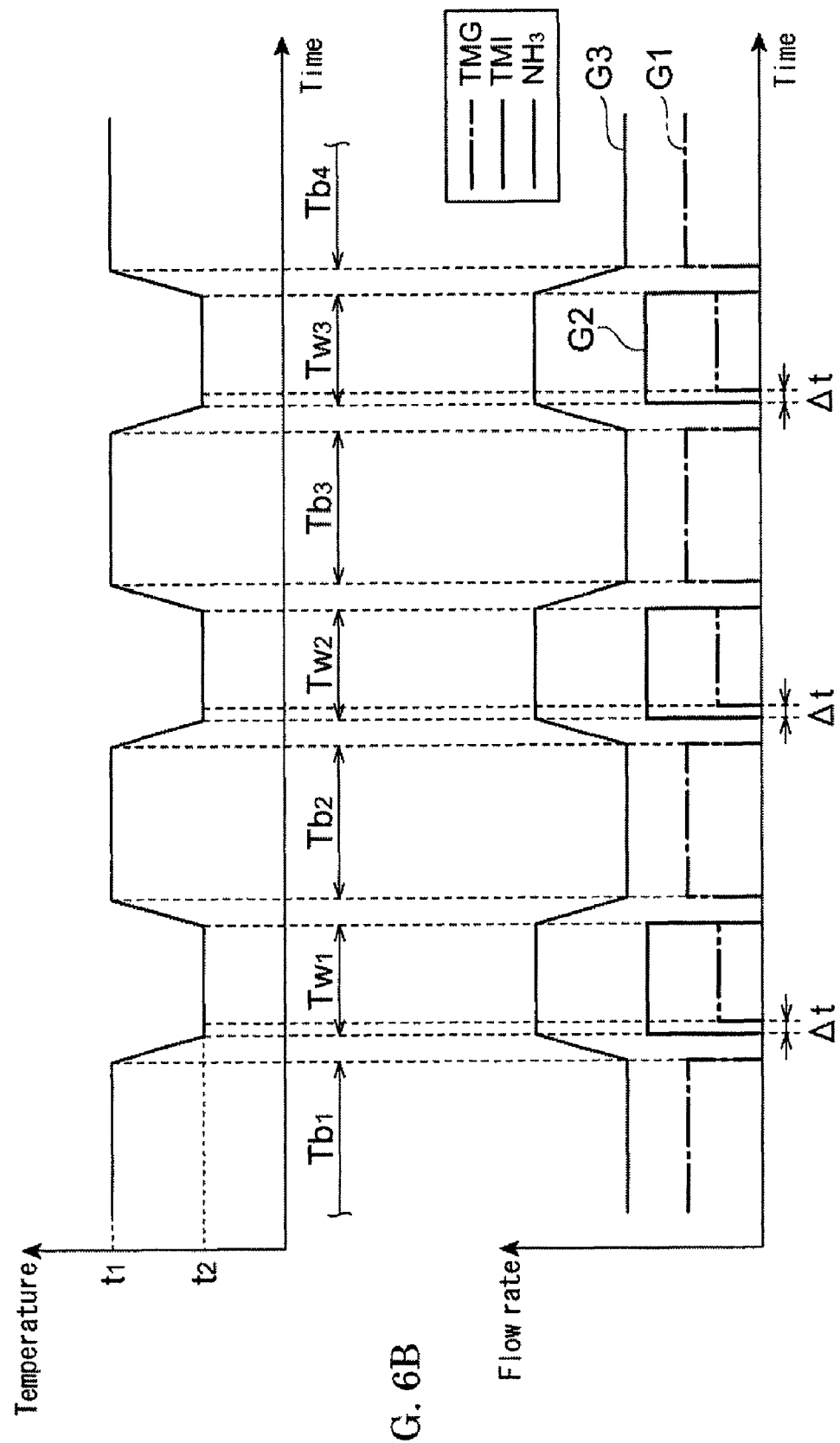
Figures 7A, 7B:
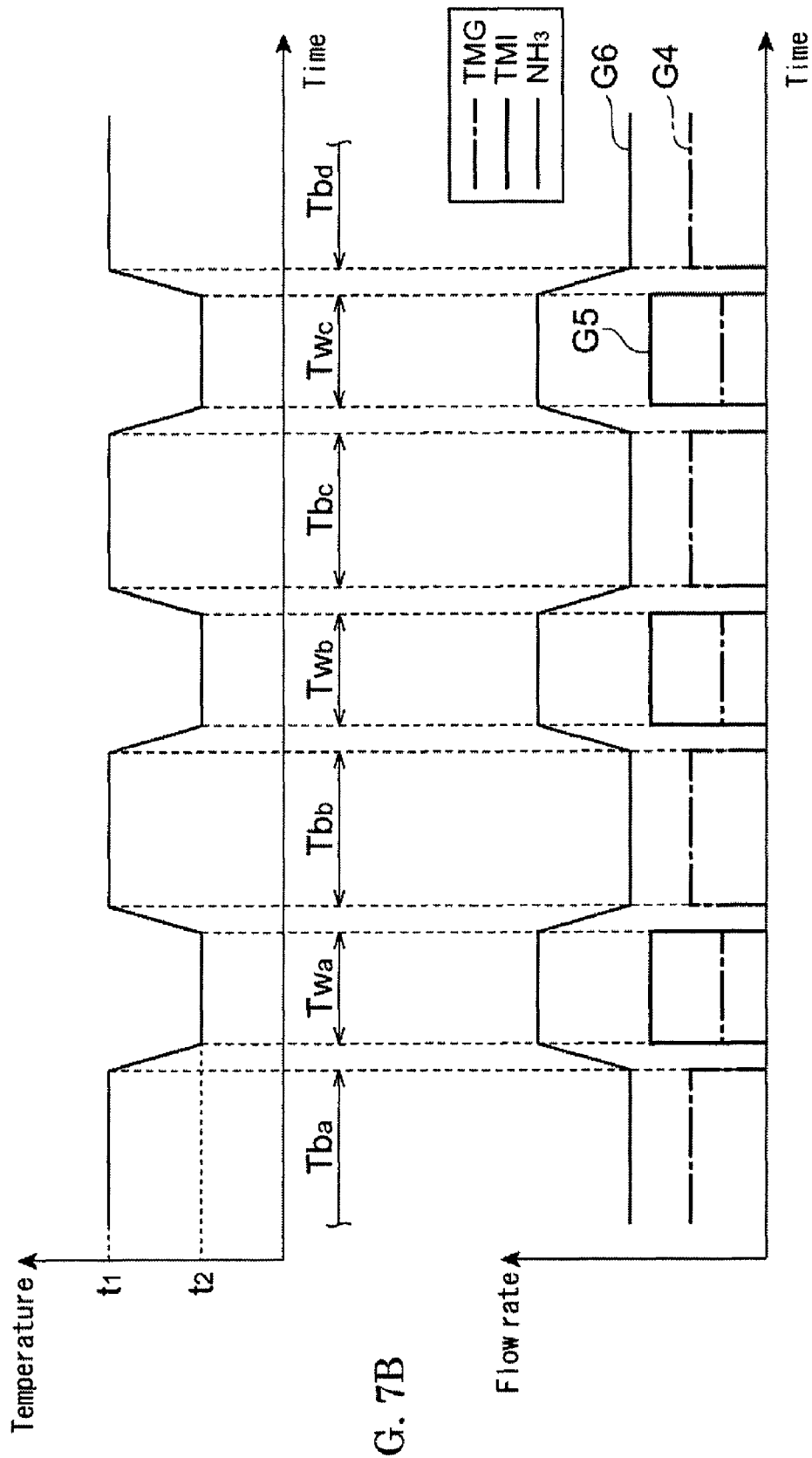
Figure 8A:
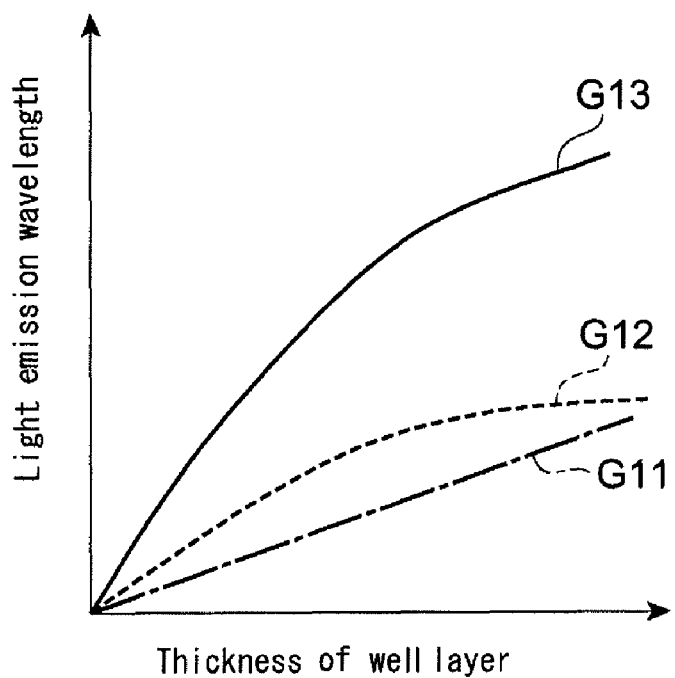
Figure 8B:
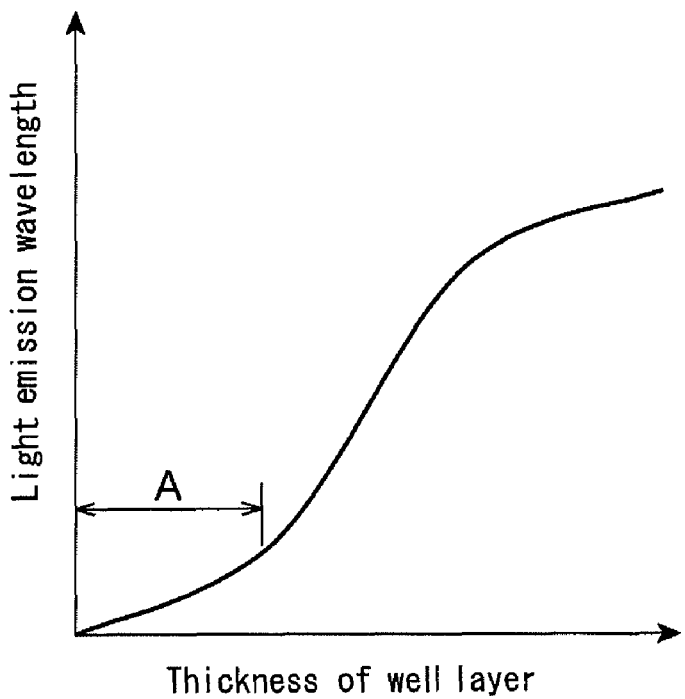
Figure 9A:
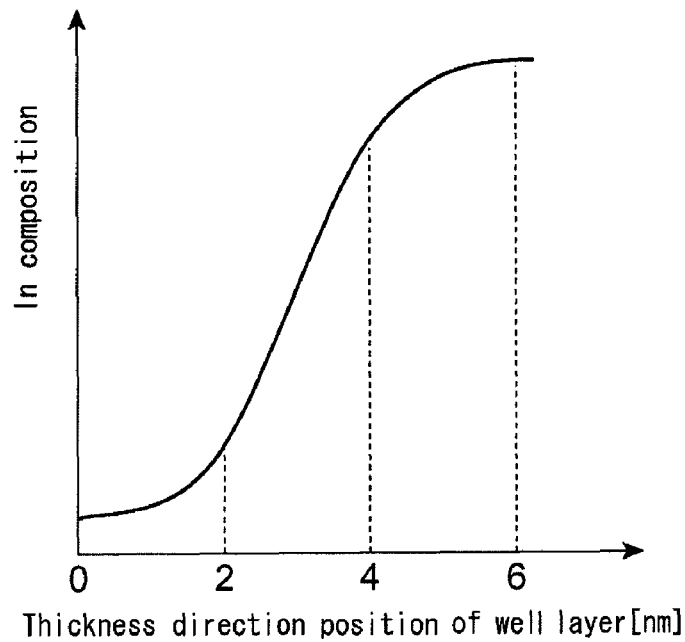
Figure 9B:
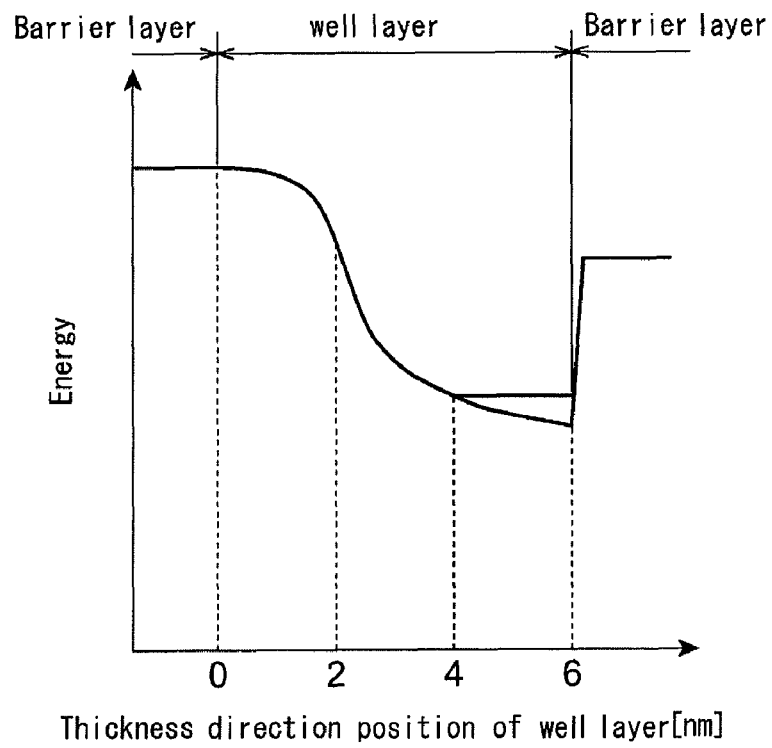
Figure 10A:
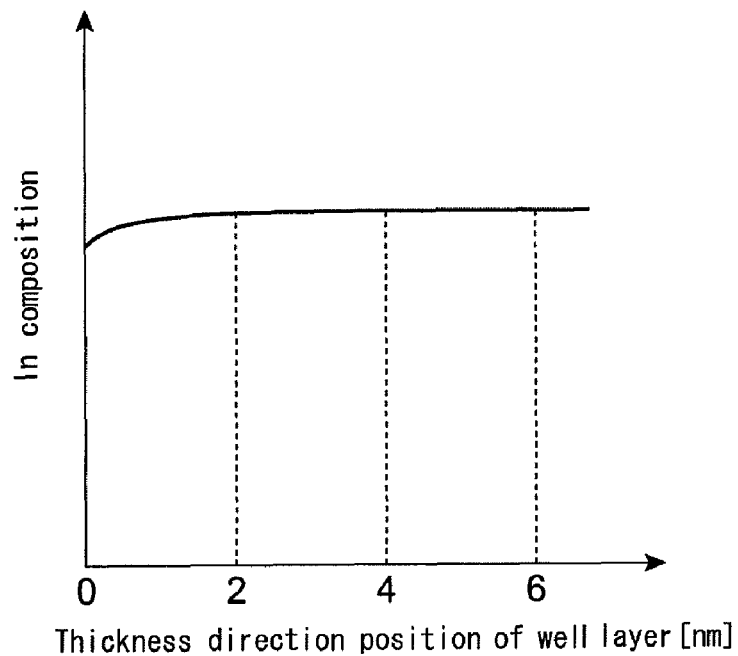
Figure 10B:
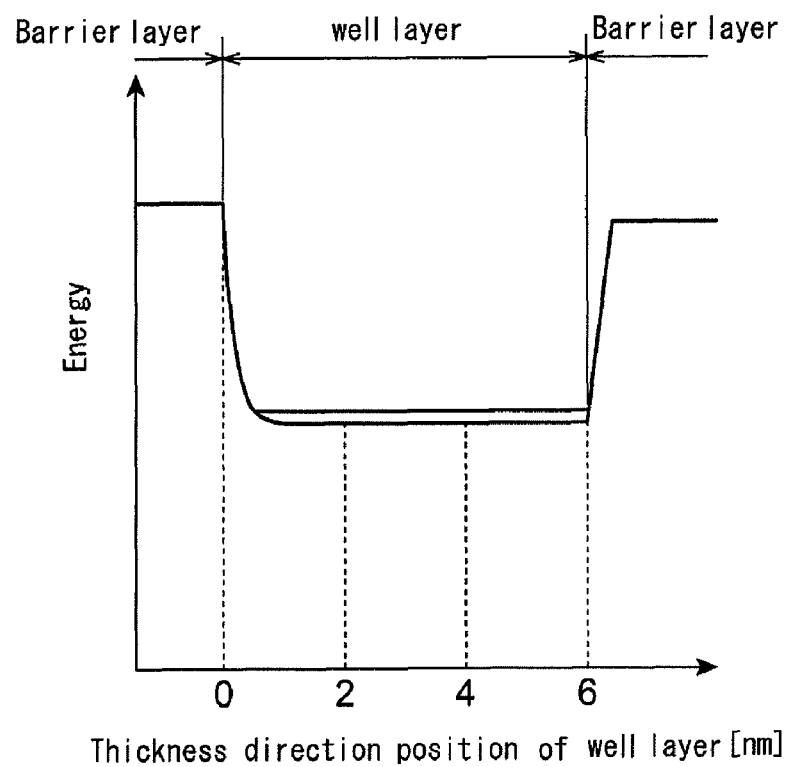
Figure 11A:
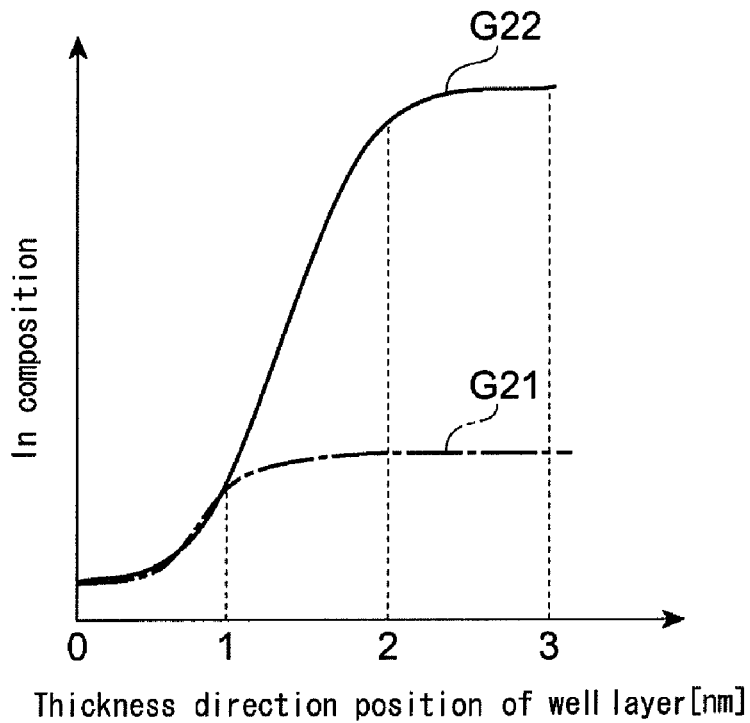
Figure 11B:
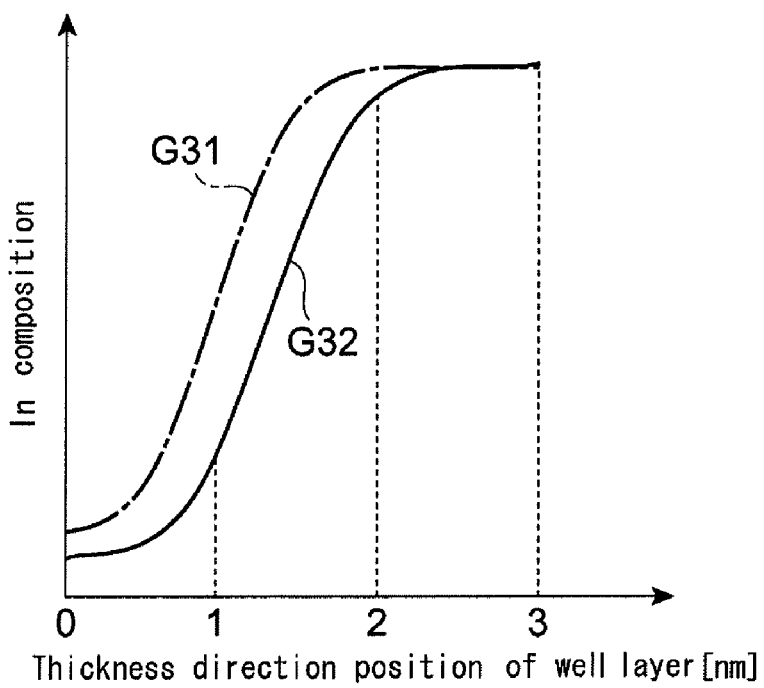
Figure 12:
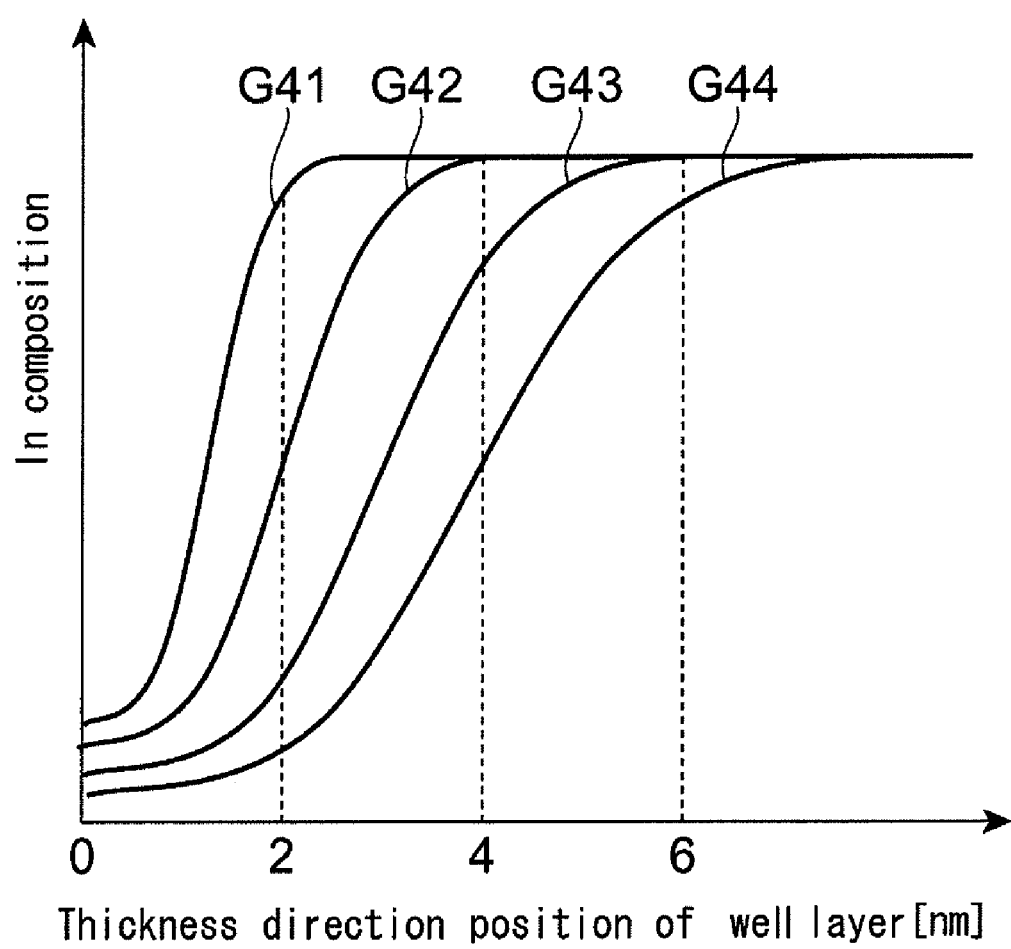
Figure 13:
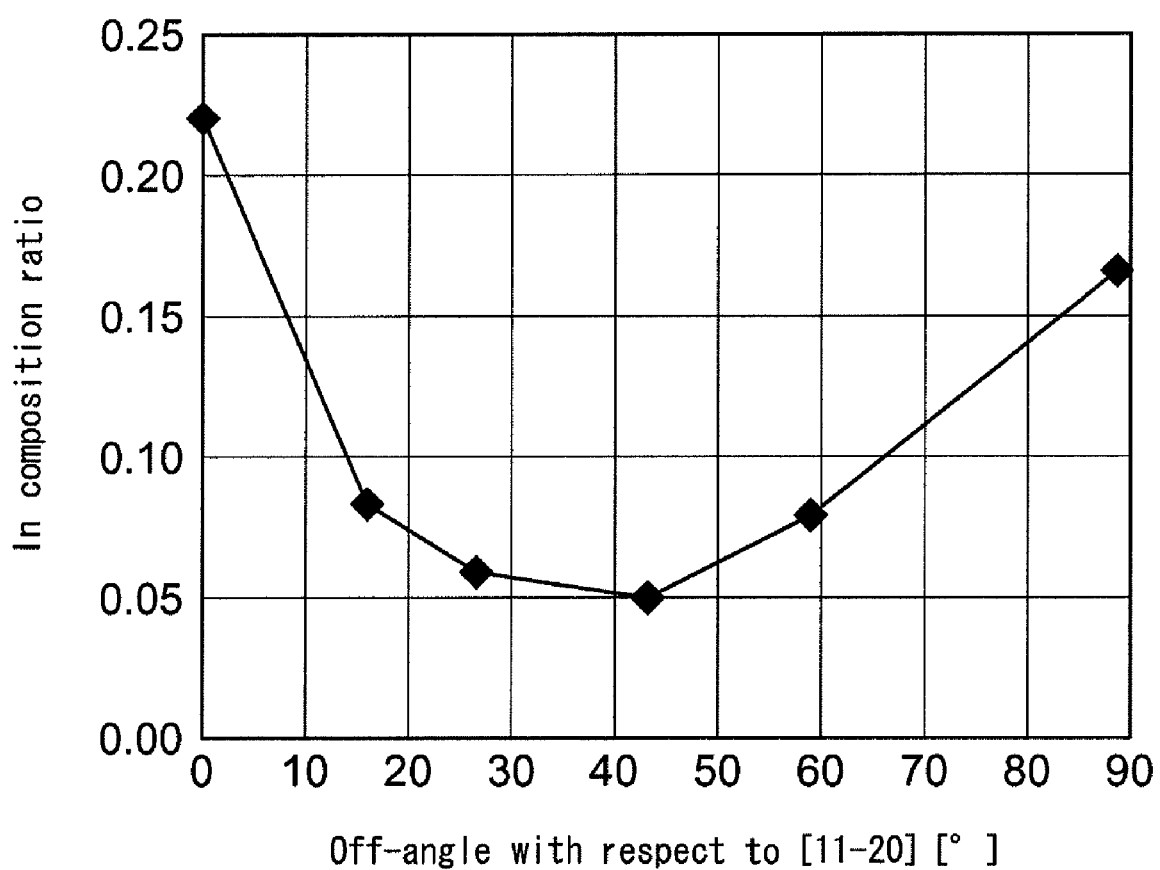

Part (A) and part (B) of FIG. 6 show the change in substrate temperature (furnace temperature) and the changes in flow rate of starting material gases, respectively, when a multi-quantum well structure is formed;

Part (A) and part (B) of FIG. 7 show the change in substrate temperature (furnace temperature) and the changes in flow rate of starting material gases, respectively, according to a related method for forming a quantum well structure;

FIG. 8A is a graph showing a theoretical relationship between the light emission wavelength and the thickness of a well layer composed of InGaN;

FIG. 8B is a graph showing wavelength properties of a semiconductor light emitting element formed by a related method;

FIG. 9A is a graph showing the relationship between the In composition and the thickness direction position of a well layer in the quantum well structure formed by the related method;

FIG. 9B is a graph showing the relationship between the band structure and the thickness direction position of the well layer in the quantum well structure formed by the related method;

FIG. 10A is a graph showing the relationship between the In composition and the thickness direction position of a well layer in a quantum well structure formed by a method according to the embodiment;

FIG. 10B is a graph showing the relationship between the band structure and the thickness direction position of the well layer in the quantum well structure formed by the method according to the embodiment;

FIG. 11A is a graph showing the relationships between the In composition and the thickness direction position of the well layers in the quantum well structure formed by the related method, the relationships being obtained when targeted In compositions of the well layers are set to 10% (line G21) and 30% (line G22);

FIG. 11B is a graph showing the relationships between the In composition and the thickness direction position of the well layers in the quantum well structure formed by the related method, the relationships being obtained when the barrier layers are composed of InGaN (line G31) and GaN (line G32);

FIG. 12 is a graph showing the relationships between the In composition and the thickness direction position of the well layers in the quantum well structure formed by the related method, the relationships being obtained when inclined angles (off-angle) of a primary surface with respect to the c-plane of a GaN substrate are set to 0° (line G41), 15° or 75° (line G42), 30° or 60° (line G43), and 45° (line G44); and FIG. 13 is a graph showing the relationship between an In composition ratio in InGaN crystal and the off-angle with respect to the c-plane.

DESCRIPTION OF THE PREFERRED EMBODIMENTS

Hereinafter, with reference to the accompanying drawings, an embodiment of a method for forming a quantum well structure and a method for manufacturing a semiconductor light emitting element, according to the present invention, will be described in detail. In illustration of the drawings, the same elements are designated by the same reference numerals, and a duplicated description is omitted.

Figure 1:
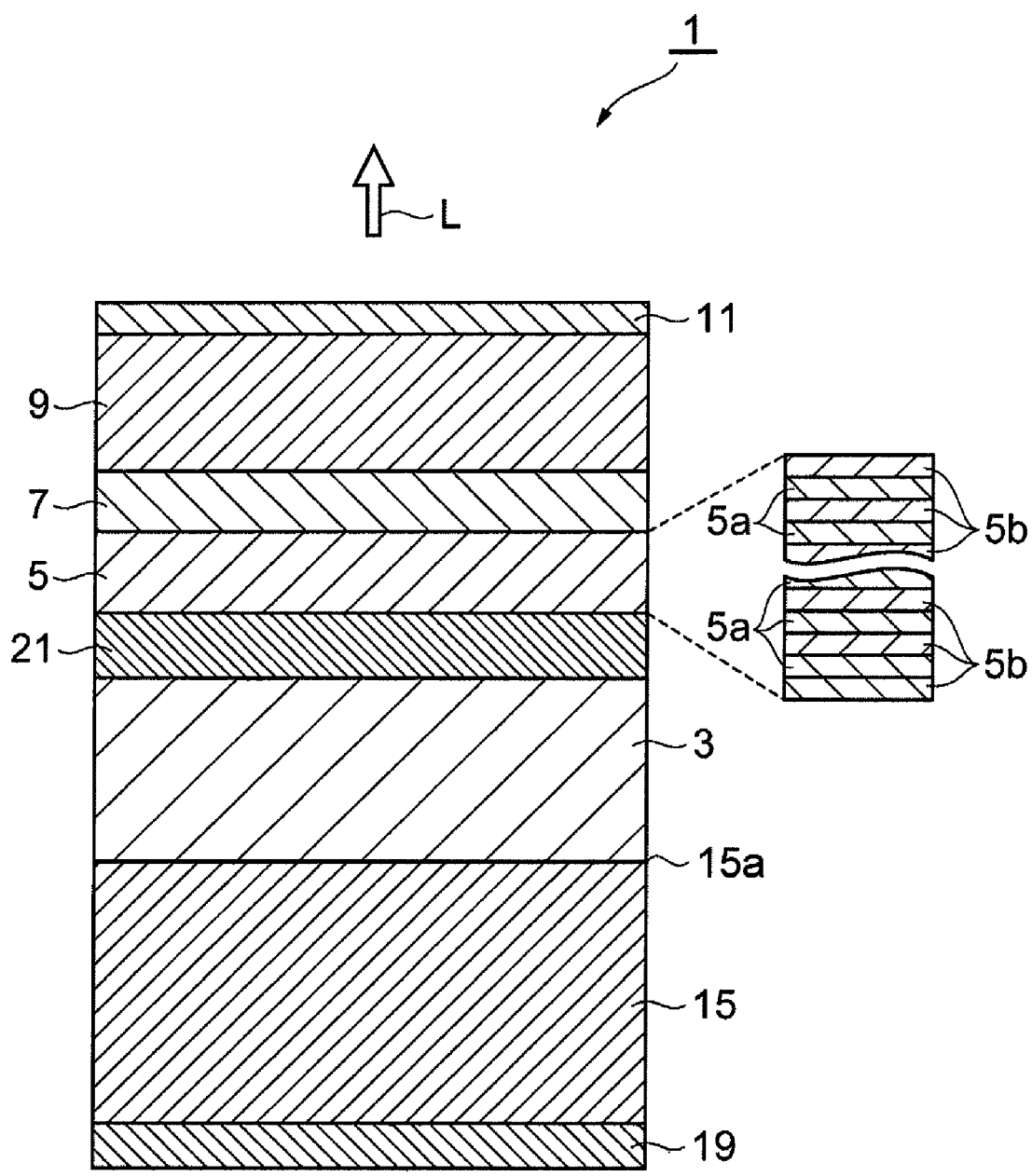
FIG. 1 is a side cross-sectional view schematically showing the structure of a semiconductor light emitting element manufactured by a method for manufacturing a semiconductor light emitting element according to an embodiment.

FIG. 1 is a side cross-sectional view schematically showing the structure of a semiconductor light emitting element 1 as one example of a semiconductor light emitting element manufactured by the method for manufacturing a semiconductor light emitting element according to this embodiment. As the semiconductor light emitting element 1, for example, a surface light emitting diode may be mentioned. The semiconductor light emitting element 1 includes an n-type gallium nitride-based semiconductor layer such as an n-type GaN semiconductor layer 3, an active layer 5 having a multiquantum well structure, a p-type AlGaN semiconductor layer 7, a p-type gallium nitride-based semiconductor layer such as a p-type GaN semiconductor layer 9, and an electrode 11. The active layer 5 is provided on the n-type GaN semiconductor layer 3 and is formed by the method for forming a quantum well structure according to this embodiment. The p-type AlGaN semiconductor layer 7 is provided on the active layer 5. The p-type GaN semiconductor layer 9 is provided on the p-type AlGaN semiconductor layer 7. The electrode 11 is in contact with the p-type GaN semiconductor layer 9 and is, for example, an anode. This contact is preferably an ohmic contact.

The n-type GaN semiconductor layer 3 functions as a lower clad layer or a buffer layer. The thickness of the n-type GaN semiconductor layer 3 is, for example, 2 μm. In addition, the p-type AlGaN semiconductor layer 7 functions as an electron block layer for reducing electron leakage from the active layer 5 and for increasing light emission efficiency. The thickness of the p-type AlGaN semiconductor layer 7 is, for example, 20 nm. The p-type GaN semiconductor layer 9 functions as a contact layer to be electrically connected to the electrode 11. The thickness of the p-type GaN semiconductor layer 9 is, for example, 50 nm.

The semiconductor light emitting element 1 further includes an n-type GaN substrate 15. The n-type GaN substrate 15 has a primary surface 15a. The primary surface 15a is inclined with respect to the (0001) plane, that is, the c plane, and the inclined angle (so-called off-angle) of the primary surface 15a is in the range of 10° to 80° and is, for example, 18°. The n-type GaN semiconductor layer 3 is provided on the primary surface 15a of the n-type GaN semiconductor substrate 15, and an electrode 19 (cathode) is in contact with the rear surface of the n-type GaN substrate 15.

The active layer 5 includes InGaN well layers 5a and barrier layers 5b which are alternately laminated to each other. The well layer 5a is a group III nitride semiconductor layer including In and another group III element other than In and may be composed, for example, of InGaN. The barrier layer 5b is composed of a gallium nitride-based semiconductor and may be composed, for example, of InGaN in which the In composition is lower than that of the well layer 5a. In addition, as a material for the barrier layer 5b, GaN may also be used whenever necessary. The structure of the active layer 5 is not limited to a multiquantum well structure and may be a single quantum well structure. The thickness of the well layer 5a is preferably in the range of 2 to 6 nm and is for example, 3 nm, and the thickness of the barrier layer 5b is preferably larger than that of the well layer 5a and is, for example, 15 nm. Light L from the active layer 5 is emitted through the electrode 11.

The semiconductor light emitting element 1 further includes an n-type gallium nitride-based buffer layer, such as an n-type InGaN buffer layer 21. The n-type InGaN buffer layer 21 is provided between the n-type GaN semiconductor layer 3 and the active layer 5. The c-axis lattice constant of the well layer 5a composed of InGaN is larger than the c-axis lattice constant (0.51851 nm) of the n-type GaN semiconductor layer 3 composed of GaN. In this semiconductor light emitting element 1, in order to reduce the strain of the active layer 5 caused by the difference in lattice constant between the n-type GaN semiconductor layer 3 and the active layer 5, the n-type InGaN buffer layer 21 is provided. As a result, the active layer 5 may be grown while the influence of the difference in lattice constant with GaN is being reduced.

In the semiconductor light emitting element 1, the n-type InGaN buffer layer 21 is preferably composed of low-temperature grown InGaN, and the thickness thereof is, for example, 50 nm. The growth temperature of the low-temperature grown InGaN is preferably, for example, 800° C. or less and is also preferably, for example, 300° C. or more.

Figure 2:
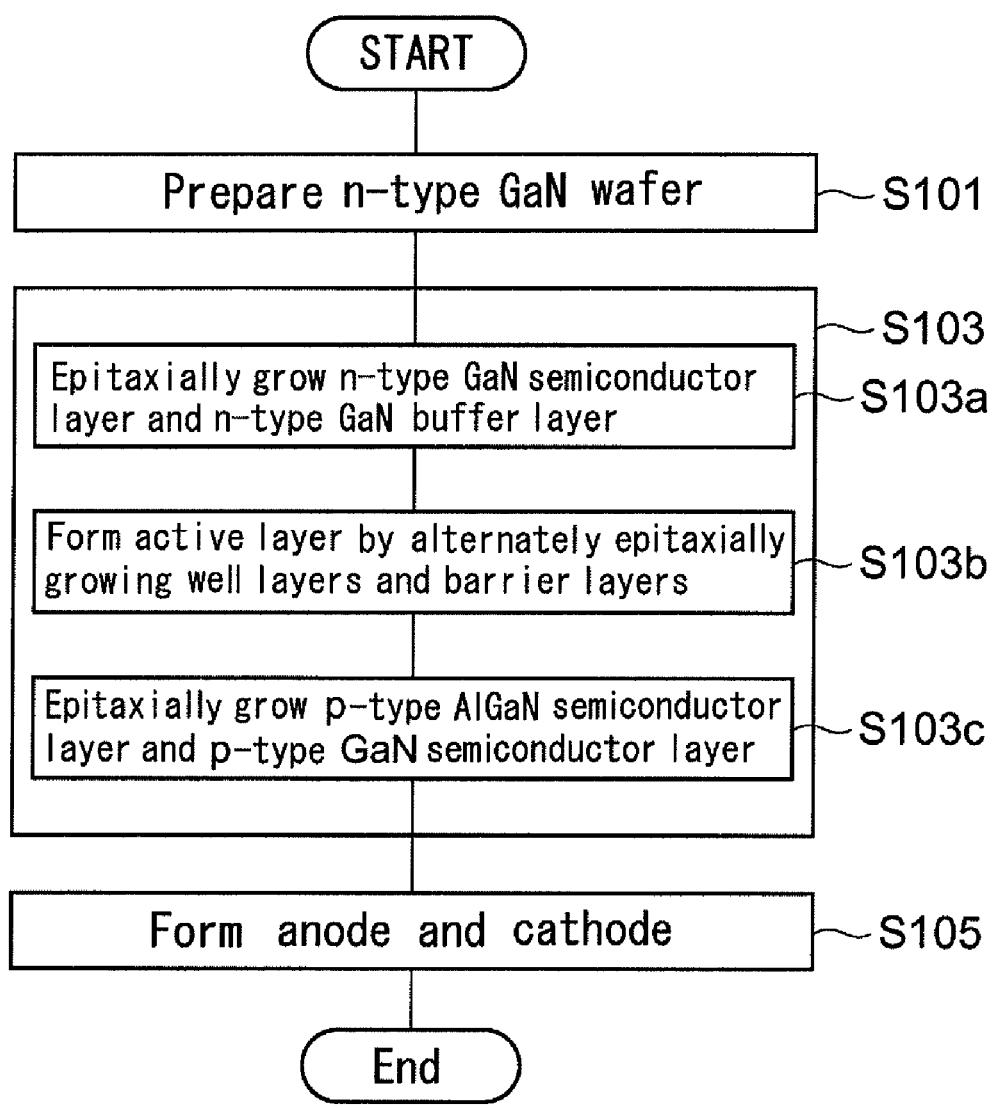
FIG. 2 is a flowchart showing primary steps of the method for manufacturing a semiconductor light emitting element according to the embodiment.
Figure 3A:
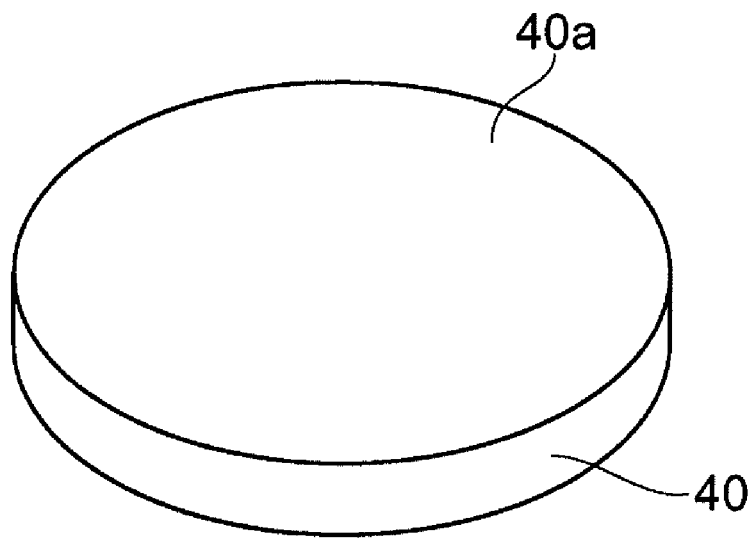
FIGS. 3A and 3B are views each illustrating the step shown in FIG. 2.
Figure 3B:
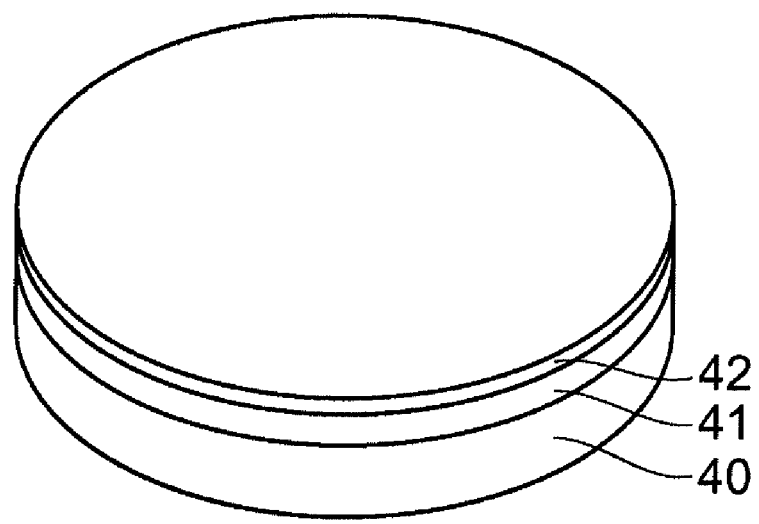

FIG. 2 is a flowchart showing primary steps of the method for manufacturing the semiconductor light emitting element 1 according to this embodiment. In addition, FIGS. 3A to 5B are views illustrating the steps shown in FIG. 2. First, in Step S101 of FIG. 2, as shown in FIG. 3A, an n-type GaN substrate 40 in the form of a wafer including a primary surface 40a which has an off-angle with respect to the c plane is prepared. Next, in Step S103, a substrate product, which is called an epitaxial wafer, is manufactured. In Step S103a, as shown in FIG. 3B, an n-type GaN semiconductor layer 41 and an n-type InGaN buffer layer 42 are epitaxially grown in this order on the primary surface 40a of the n-type GaN substrate 40. The thicknesses of the n-type GaN semiconductor layer 41 and the n-type InGaN buffer layer 42 are, for example, 2 μm and 50 nm, respectively. The growth of the above layers may be performed, for example, in a metal organic chemical vapor deposition (MOCVD) furnace.

Figure 4A:
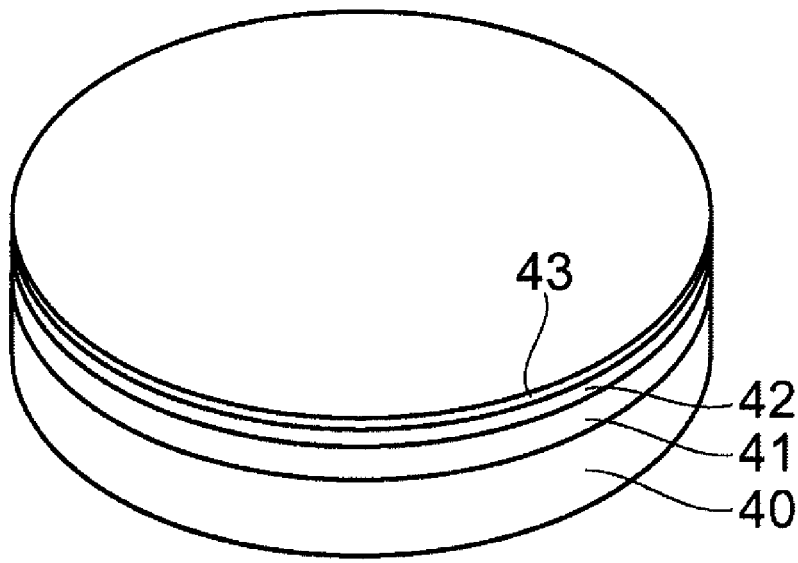
FIGS. 4A and 4B are views each illustrating the step shown in FIG. 2.
Figure 4B:
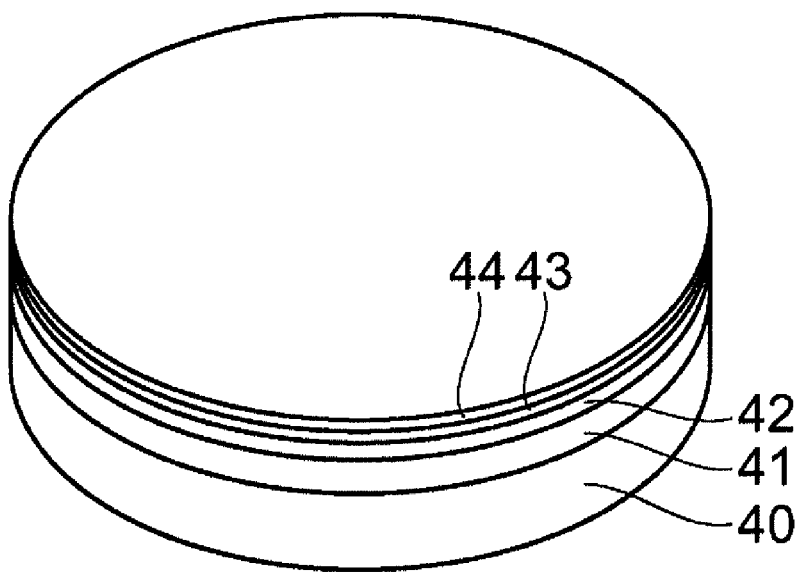
Figure 5A:
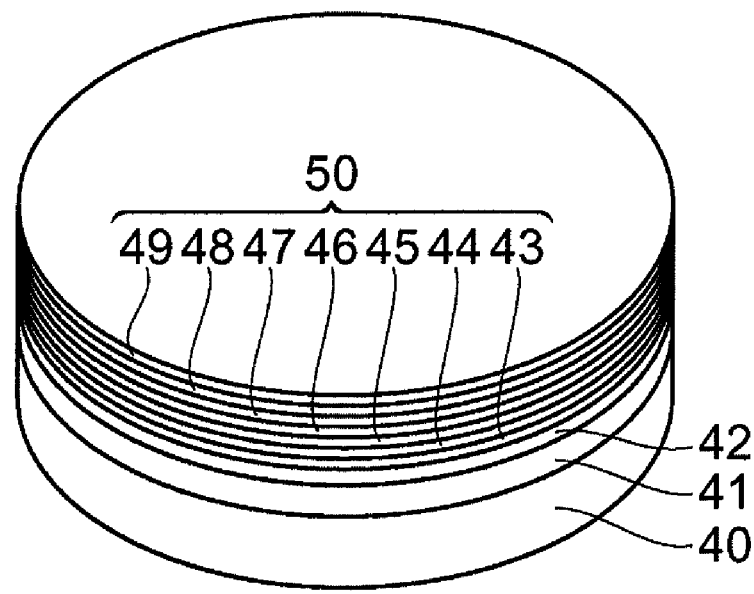
FIGS. 5A and 5B are views each illustrating the step shown in FIG. 2.

In the following Step S103b, by alternately growing barrier layers and well layers, an active layer having a quantum well structure is formed on the n-type InGaN buffer layer 42. As shown in FIG. 4A, first, a barrier layer 43 is epitaxially grown on the n-type InGaN buffer layer 42. The barrier layer 43 is composed of a gallium nitride-based semiconductor and is composed, for example, of GaN. Alternatively, the barrier layer 43 is composed of InGaN having an indium composition lower than that of a well layer which is to be grown in the following step. The thickness of the barrier layer 43 is, for example, 15 nm. Next, by growing a group III nitride semiconductor including In and another group III element on the barrier layer 43, a well layer 44 shown in FIG. 4B is formed. In this case, the other group III element is, for example, Ga, and the well layer 44 is composed, for example, of InGaN. The thickness of the well layer 44 is preferably in the range of 2 to 6 nm and is, for example, 3 nm. Subsequently, as shown in FIG. 5A, a barrier layer 45, a well layer 46, a barrier layer 47, a well layer 48, and a barrier layer 49 are sequentially formed on the well layer 44, so that an active layer 50 having a three-period multiquantum well structure is formed. The growth of the layers described above may be performed, for example, in an MOCVD furnace.

In addition, since the n-type InGaN buffer layer 42 composed of low-temperature grown InGaN is provided on the n-type GaN semiconductor layer 41 having a thickness of 2 μm, the influence of the strain of the InGaN well layers of the active layer 50 is reduced. In addition, as described above, the primary surface 40a of the n-type GaN substrate 40 has an off-angle with respect to the c-plane. Accordingly, a semiconductor light emitting element that can reduce the influence of a piezoelectric field can be formed.

Figure 5B:
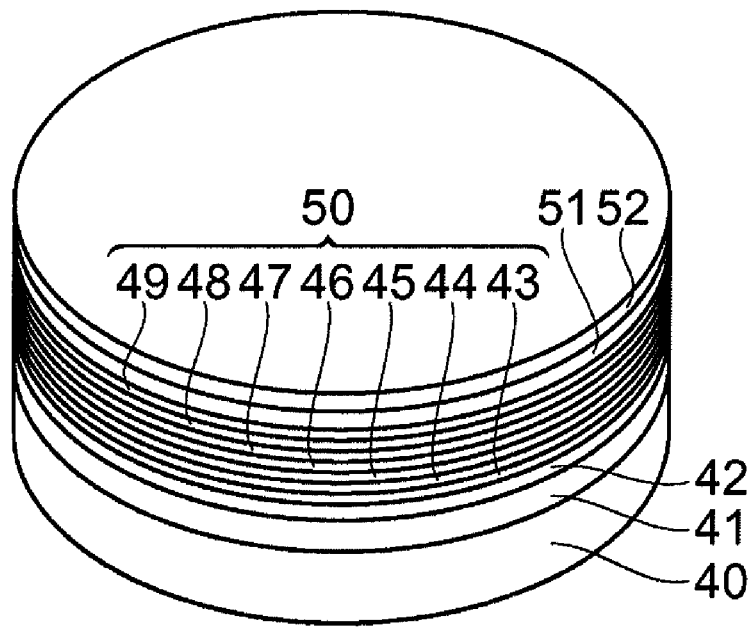

In the following Step S103c, as shown in FIG. 5B, a p-type AlGaN semiconductor layer 51 and a p-type GaN semiconductor layer 52 are epitaxially grown on the active layer 50. The p-type AlGaN semiconductor layer 51 is, for example, an electron block layer, and the p-type GaN semiconductor layer 52 is, for example, a contact layer. The thicknesses of the p-type AlGaN semiconductor layer 51 and the p-type GaN semiconductor layer 52 are, for example, 20 and 50 nm, respectively. By the steps described above, the epitaxial wafer is formed.

In Step S105, a transparent electrode (anode) is formed on the p-type GaN semiconductor layer 52 of the epitaxial wafer. Furthermore, another electrode (cathode) is formed on the rear surface of the n-type GaN substrate 40. Finally, by dividing this epitaxial wafer into chips, the semiconductor light emitting elements 1 are formed.

Subsequently, the method for forming a multiquantum well structure according to this embodiment will be described in detail. Part (A) of FIG. 6 shows the change in substrate temperature (intra-furnace temperature) when the multiquantum well structure is formed, and part (B) of FIG. 6 shows the changes in flow rate of starting material gases when the multiquantum well structure is formed. In addition, periods $Tb_1$ to $Tb_4$ shown in the parts (A) and (B) of FIG. 6 indicate the periods of growing the barrier layers 43, 45, 47, and 49, respectively, and periods $Tw_1$ to $Tw_3$ indicate the periods of growing the well layers 44, 46, and 48, respectively. Furthermore, in the part (B) of FIG. 6, a line G1 indicates the flow rate of TMG which is a starting material gas for Ga, a line G2 indicates the flow rate of TMI which is a starting material gas for In, and a line G3 indicates the flow rate of $NH_3$ which is a starting material gas for N.

When the multiquantum well structure is formed, first, during the period $Tb_1$, the growth temperature, that is, the substrate temperature, is set to a first temperature $t_1$ (such as 880° C.). Subsequently, TMG, which is the starting material gas for Ga, and $NH_3$, which is the starting material gas for N, are supplied to a growth furnace so as to start the growth of the barrier layer 43 composed of GaN.

After the barrier layer 43 is grown to a predetermined thickness, while the supply of $NH_3$ is continued, the supply of TMG is stopped, and the growth temperature (substrate temperature) is decreased to a second temperature $t_2$ ($<t_1$, such as 700° C.). The reason the temperature is decreased is to increase the In composition of the well layer by 15% or more, such as 30%. By forming a well layer having a high In composition as described above, a well layer having a PL wavelength from a green to a red color range, for example, in the range of 450 to 650 nm can be preferably formed. After the growth temperature reaches the temperature $t_2$, during the period $Tw_1$, while TMI, which is the starting material gas for In, and $NH_3$, which is the starting material gas for N, are supplied to the growth furnace, the growth of the well layer 44 is started. At the growth start stage, the supply of TMG, which is the starting material gas for Ga, is stopped.

In addition, after a predetermined time Δt passes from the start of the supply of TMI, the supply of TMG is started. The predetermined time Δt is a time of 1 minute or less and is, for example, 10 seconds. The predetermined time Δt is optionally changed in accordance with a necessary thickness, In composition, and the like of the well layer 44. Accordingly, since TMI, TMG, and $NH_3$ are supplied to the growth furnace, the well layer 44 composed of InGaN is grown. In addition, when the well layer 44 is grown, the supply amount of $NH_3$ is preferably increased as compared to that for forming the barrier layer 43.

After the well layer 44 is grown to a desired thickness, while the supply of $NH_3$ is continued, the supply of TMG and that of TMI are stopped, and the growth temperature is again increased to the first temperature $t_1$. Next, after the temperature reaches the first temperature $t_1$, the supply of TMG is again started, and the barrier layer 45 composed of GaN is grown during the period $Tb_2$. Subsequently, in a manner similar to each of the steps of growing the well layer 44 and the barrier layer 45, the well layer 46 is grown during the period $Tw_2$, the barrier layer 47 is grown during the period $Tb_3$, the well layer 48 is grown during the period $Tw_3$, and the barrier layer 49 is grown during the period $Tb_4$.

The effects obtained from the method for forming a quantum well structure and the method for manufacturing a semiconductor light emitting element, according to this embodiment, will be described with reference to problems of a related art. For comparison purpose, Parts (A) and (B) of FIG. 7 show the change in substrate temperature (intra-furnace temperature) and the changes in flow rate of starting material gases, respectively, according to a related method for forming a quantum well structure. In addition, in the parts (A) and (B) of FIG. 7, periods $Th_a$ to $Th_d$ each indicate a period for growing a barrier layer, and periods $Tw_a$ to $Tw_c$ each indicate a period for growing a well layer. Furthermore, in the part (B) of FIG. 7, a line G4 indicates the flow rate of TMG which is the starting material gas for Ga, a line G5 indicates the flow rate of TMI which is the starting material gas for In, and a line G6 indicates the flow rate of $NH_3$ which is the starting material gas for N. The point of the related method shown in the parts (A) and (B) of FIG. 7 different from the method according to this embodiment is that when the well layers are grown (during the periods $Tw_a$ to $Tw_c$), the supply of TMI, TMG, and $NH_3$ are simultaneously started.

Through intensive research carried out by the inventors of the present invention, it was found that by the related method shown in the parts (A) and (B) of FIG. 7, due to the difference in lattice constant between the barrier layer and the well layer, the In composition of the well layer becomes insufficient at an early growth stage thereof. That is, immediately after the start of the growth of the InGaN well layer, In is not sufficiently incorporated right on the GaN barrier layer, and the In composition gradually increases as the well layer grows; hence, a desired In composition is realized when the thickness of the well layer reaches a certain level.

FIG. 8A is a graph showing a theoretical relationship between the light emission wavelength and the thickness of a well layer composed of InGaN. As shown by a line G12 in the figure, the quantum confinement effect decreases as the thickness of the well layer is increased, and the light emission wavelength is increased. In addition, as shown in a line G11 in the figure, the band is bent since the piezoelectric field is generated in the thickness direction as the thickness of the well layer is increased, and hence the light emission wavelength is increased as the thickness of the well layer is increased. Accordingly, when these behaviors are combined with each other, the theoretical relationship between the light emission wavelength and the thickness of the well layer is obtained as shown by a line G13 in the figure, and hence it is believed that the light emission wavelength is increased as the thickness of the well layer is increased.

However, when the wavelength properties of the semiconductor light emitting element formed by the related method shown in the parts (A) and (B) of FIG. 7 were investigated, it was found that as shown in FIG. 8B, when the thickness of the well layer is small (the range A in the figure), the light emission wavelength is not so much increased as compared to that theoretically estimated. Also from this result, it was found that a sufficient amount of In is not incorporated into the well layer at the early growth stage thereof, and that thereby the In composition is insufficient.

FIGS. 9A and 9B show, respectively, the relationship between the In composition and the thickness direction position of the well layer and the relationship between the band structure and the thickness direction position of the well layer of the quantum well structure formed by the related method. As described above, the In composition is low at the early growth stage of the InGaN well layer, and as the InGaN well layer grows, the strain is reduced, so that the In composition tends to increase (FIG. 9A). In particular, in the range of from a growth starting face to a thickness of 2 nm or less in the InGaN well layer, the In composition tends to be suppressed low. As a result, since the variation in the In composition occurs in the thickness direction of the well layer, the band structure of the well layer becomes as shown in FIG. 9B, and the range of the light emission wavelength is increased, so that the half bandwidth of the light emission spectrum is increased. In addition, the change in band gap at a hetero interface unfavorably becomes slow, and hence there may arise problems, for example, in that the carrier confinement effect is degraded and in that the light emission intensity is decreased since the volume of the well layer which contributes to light emission is decreased.

Accordingly, in the method for forming a quantum well structure and method for manufacturing a semiconductor light emitting element according to this embodiment, when the well layers 44, 46, and 48 composed of InGaN are grown, before the starting material gas for Ga (TMG) is supplied, the starting material gas for In (TMI) and the starting material gas for N (NH$_3$) are supplied as shown in the part (B) of FIG. 6. As a result, during the period Δt until the starting material gas for Ga (TMG) is supplied, In atoms and InN molecules are migrating on each of the barrier layers 43, 45, and 47. Next, by sequentially growing the well layers 44, 46, and 48 by starting the supply of the starting material gas for Ga (TMG), the In atoms and the InN molecules migrating at the early stage are incorporated into each of the well layers 44, 46, and 48, so that the decrease in the In composition of the well layers 44, 46, and 48 at the early growth stage can be suppressed. Hence, the variation in the In composition in the thickness direction of the well layers 44, 46, and 48 can be reduced, and in addition, even when the thicknesses of the well layers 44, 46, and 48 are small, such as 3 nm, a desired In composition can be realized.

FIGS. 10A and 10B show, respectively, the relationship between the In composition and the thickness direction position of the well layer and the relationship between the band structure and the thickness direction position of the well layer in the quantum well structure formed by the method according to this embodiment. According to the method of this embodiment, the states in which In is excessively present on the barrier layers 43, 45, and 47 can be formed at the early growth stages of the well layers 44, 46, and 48 composed of InGaN, and hence the amount of In to be incorporated can be increased. Accordingly, since a well layer having a uniform In composition in the thickness direction as shown in FIG. 10A can be formed, the band structures of the well layers 44, 46, and 48 become as shown in FIG. 10B, and the spread of the light emission wavelength is suppressed, so that the half bandwidth of the light emission spectrum can be decreased. Furthermore, since the change in band gap at a hetero interface becomes steep, the carrier confinement effect can be enhanced, and since the volumes of the well layers which contribute to light emission are increased, the light emission intensity can be increased. In addition, when the band structures of the well layers 44, 46, and 48 are flat, an increase in light emission energy by the quantum confinement effect is suppressed; hence, an effect of increasing the light emission wavelength can also be obtained. In addition, it is also believed that since the piezoelectric field is uniformly generated in the thickness direction, in light emission at a small current at which the piezoelectric effect is not screened, the wavelength is further increased.

FIG. 11A is a graph showing the relationships between the In composition and the thickness direction position of the well layers in the quantum well structure formed by the related method shown in the parts (A) and (B) of FIG. 7, the relationships being obtained when targeted In compositions of the well layers are set, for example, to 10% and 30%. In FIG. 11A, a line G21 indicates the case in which the targeted In composition of the well layer is set to 10%, and a line G22 indicates the case in which the targeted In composition is set to 30%. The rates of change in the In composition with respect to the thickness direction position of the well layer are similar to each other. However, when the targeted In composition is low (shown by the line G21), the In composition reaches the targeted value when the thickness is still small, and hence the variation in the In composition in the thickness direction of a well layer having a certain thickness (such as 3 nm) is larger when the targeted In composition is high (line G22) than that when the targeted In composition is low (line G21). Hence, as the targeted In composition is higher, it can be said that the effect obtained by the method of this embodiment is significant. For example, as in this embodiment, in the case in which the In compositions of the well layers 44, 46, and 48 are increased by decreasing the growth temperature (second temperature $t_2$) for the well layers 44, 46, and 48 lower than the growth temperature (first temperature $t_1$) for the barrier layers 43, 45, and 47, in particular, the variation in the In composition in the thickness direction can be effectively reduced. Hence, a well layer having a long PL wavelength in the range of, for example, 450 to 650 nm can be preferably formed.

In addition, FIG. 11B shows the relationships between the In composition and the thickness direction position of the well layers in the quantum well structure formed by the related method shown in the parts (A) and (B) of FIG. 7, the relationships being obtained when the barrier layers are composed of InGaN (line G31) and GaN (line G32). As shown in FIG. 11B, in the case in which the barrier layer is composed of InGaN (line G31), the In composition starts to increase when the thickness is still small as compared to the case in which the barrier layer is composed of GaN (line G32). Hence, compared to the case in which the barrier layer is composed of InGaN, the variation in the In composition in the thickness direction is increased in the case in which the barrier layer is composed of GaN; however, when the In composition is excessively increased, the difference in band gap between the well layer and the barrier layer is decreased, and as a result, the carrier confinement effect by the quantum well structure is degraded. On the other hand, according to the method of this embodiment, even in the case in which the barrier layer is composed of GaN or is composed of InGaN having a low In composition, the variation in the In composition can be effectively reduced; hence, the difference in band gap between the well layer and the barrier layer can be increased, so that the carrier confinement effect can be effectively obtained.

In the quantum well structure formed by the related method shown in the parts (A) and (B) of FIG. 7, FIG. 12 is a graph showing the relationships between the In composition and the thickness direction position of the well layers, the relationships being obtained when the inclined angles (off-angles) of the primary surface of the GaN substrate with respect to the c-plane are set to 0° (line G41), 15° or 75° (line G42), 30° or 60° (line G43), and 45° (line G44). In addition, FIG. 13 is a graph showing the relationship between an In composition ratio of the InGaN crystal and the off-angle with respect to the c-plane. As shown in FIG. 13, compared to the case in which the off-angle is 0° (that is, when an InGaN crystal is grown on a GaN substrate in which the c-plane is the primary surface), it was found that the In composition ratio is decreased when the off-angle is more than 0°, and that as the off-angle is increased, In becomes difficult to be incorporated into the crystal (the In composition ratio is decreased). Hence, as shown in FIG. 12, as the off-angle is closer to 45°, the In composition is more unlikely to increase until the thickness is increased (until the crystal growth reaches a certain advanced level), and the variation in the In composition is increased.

When the off-angle of the GaN substrate is large, and In is not likely to be incorporated as described above, the method of this embodiment shows a significant effect and can effectively reduce the variation in the In composition. That is, as in this embodiment, the primary surface of the n-type GaN substrate 40 may be inclined with respect to the c-plane. When the light emission wavelength of the well layers 44, 46, and 48 are set from a green to a red color wavelength range, for example, from 450 to 650 nm (in particular, in a green color wavelength range of from 450 to 550 nm), the n-type GaN substrate 40 having an off-angle as described above is used; however, according to the method of this embodiment, even in the case as described above, the In amount to be incorporated can be increased, and the variation in the In composition can be effectively reduced.

In addition, as in this embodiment, the In composition of the well layers 44, 46, and 48 may be 15% or more. When the well layers 44, 46, and 48 having a relatively high In composition as described above are grown, since the amount of In incorporated at an early growth stage is small in the past, in order to obtain a desired In composition, the growth had to be performed to obtain a large thickness. However, according to the method of this embodiment, even in the case in which the well layers 44, 46, and 48 having a relatively higher In composition are grown, a desired In composition can be obtained even at a small thickness, such as 3 nm.

In addition, as in this embodiment, when the well layers 44, 46, and 48 are grown, the supply of the starting material gas for In (TMI) is preferably started after the substrate temperature reaches the second temperature $t_2$. Accordingly, the In atoms and the InN molecules are effectively migrating on each of the barrier layers 43, 45, and 47 at the early growth stages of the well layers 44, 46, and 48, respectively, so that the effect described above can be preferably obtained.

In addition, although the starting material gas for N ($NH_3$) is supplied together with the starting material gas for In (TMI) before the starting material gas for Ga (TMG) is supplied in this embodiment, the supply of $NH_3$ may be stopped, and only TMI may be supplied. In this case, during the period Δt until the supply of TMG is started, In atoms are migrating on each of the barrier layers 43, 45, and 47. Even by the method as described above, the decrease in the In composition at the early growth stages of the well layers 44, 46, and 48 can be effectively suppressed.

EXAMPLE

Next, one example of a method for manufacturing a green light emitting diode structure including high In composition well layers will be described.

First, after a GaN substrate (corresponding to the n-type GaN substrate 40 shown in FIG. 3A) having a primary surface inclined in an a-axis direction by 18° with respect to the c-plane was placed in a reaction furnace, while the pressure inside the reaction furnace was maintained at 27 kPa and a $NH_3$ gas and a $H_2$ gas were supplied thereto, a heat treatment was performed for 10 minutes at a temperature of 1,050° C. Subsequently, the substrate temperature in the reaction furnace was set to 1,150° C., and by supplying monomethylsilane (MMSi) functioning as an n-type doping source together with TMG and $NH_3$, an n-type GaN layer (corresponding to the n-type GaN semiconductor layer 41 shown in FIG. 3B) was grown so as to have a thickness of 2 μm.

Subsequently, the substrate temperature was decreased to 800° C., and by supplying TMG, TMI, $NH_3$, and MMSi to the reaction furnace, an n-type InGaN buffer layer (corresponding to the n-type InGaN buffer layer 42 shown in FIG. 3B) was grown so as to have a thickness of 50 nm. In this step, the In composition of the InGaN buffer layer was set to 5%.

Next, the substrate temperature was increased to 880° C. (first temperature $t_1$), and by supplying TMG and $NH_3$ to the reaction furnace, a GaN barrier layer (corresponding to the barrier layer 43 shown in FIG. 4A) was grown on the InGaN buffer layer so as to have a thickness of 15 nm. Subsequently, after the supply of TMG was once stopped, and the substrate temperature was decreased to 700° C. (second temperature $t_2$), TMI and $NH_3$ (or only TMI) were supplied to the reaction furnace for 10 seconds. Next, the supply of TMG was also again started, so that an $In_{0.30}GaN$ well layer (corresponding to the well layer 44 shown in FIG. 4B) was grown so as to have a thickness of 3 nm. Hereinafter, by repeatedly performing the growth of the GaN barrier layer and the $In_{0.30}GaN$ well layer in a manner similar to that described above, an active layer (corresponding to the active layer 50 shown in FIG. 5A) having a three-period multiquantum well structure was grown. The change in substrate temperature and the change in flow rate of the starting material gases in the steps described above are as shown in the parts (A) and (B) of FIG. 6, respectively.

Next, after the supply of TMG and that of TMI were stopped, the substrate temperature was increased to 1,000° C., and bis(cyclopentadienyl) magnesium ($CP_2$ Mg) functioning as a p-type doping source was supplied together with TMG, trimethylaluminum (TMA), and $NH_3$, so that a p-type AlGaN layer (corresponding to the p-type AlGaN semiconductor layer 51 shown in FIG. 5B) was grown so as to have a thickness of 20 nm. In addition, only the supply of TMA was stopped, and a p-type GaN layer (corresponding to the p-type GaN semiconductor layer 52 shown in FIG. 5B) was grown so as to have a thickness of 50 nm.

By the steps described above, an epitaxial wafer having a green light emitting diode structure in which high In composition well layers were provided was obtained. Finally, after the temperature in the reaction furnace was decreased to room temperature, and the GaN substrate was recovered from the furnace, electrodes corresponding to the electrodes 11 and 19 shown in FIG. 1 were formed, and the wafer was then divided into chips, so that green light emitting diodes were obtained.

For comparison between the epitaxial wafer formed by the above example and the epitaxial wafer of the related art formed by the method shown in the parts (A) and (B) of FIG. 7, light emission spectra obtained by optical excitation of the wafers and by current application thereto were measured, and as a result, it was found that from all light emission spectra, the wafer formed in accordance with the above example had a narrower half bandwidth and a higher light emission intensity than those of the wafer by the related method. In addition, the wafer formed in accordance with the above example had a longer light emission wavelength. The reason the half bandwidth of the light emission spectrum is narrower is believed that when the well layer is grown, by supplying TMI before TMG is supplied, the uniformity of the In composition of the well layer is improved both in the thickness direction thereof and along the wafer surface direction. In addition, as for the improvement in light emission intensity, the reason for this is believed that since the uniformity of the In composition of the well layer is improved, the band structure becomes steep at a hetero interface between the well layer and the barrier layer, and that the carrier confinement effect is enhanced thereby. Furthermore, as for the longer light emission wavelength, the reason for this is believed that since the uniformity of the In composition of the well layer is improved, a piezoelectric field generated from the difference in lattice constant between the well layer and the barrier layer becomes uniform in the thickness direction.

In addition, when these wafers were subjected to x-ray diffraction measurement, satellite peaks generated by the periodic structure of the active layer were steeper in the wafer formed in accordance with this example than that in the wafer of the related art. It is also believed that the phenomenon as described above occurs since the band structure becomes steep at a hetero interface between the well layer and the barrier layer.

The method for forming a quantum well structure and method for manufacturing a semiconductor light emitting element according to the present invention are not limited to the above embodiment and may be variously changed and modified without departing from the spirit and scope of the present invention. For example, in the above embodiment, as the example of the well layer formed of a group III nitride semiconductor including In and another group III element, the well layer of InGaN has been described by way of example; however, the constituent material for the well layer of the present invention is not limited thereto, and another group III element may be included instead of Ga, or another group III element may be included as well as Ga. Furthermore, another group V element may also be included as well as N.

In addition, the GaN substrate having an off-angle with respect to the c-plane has been described as the gallium nitride substrate in the above embodiment; however, even when a GaN substrate in which the primary surface is the c-plane is used, the present invention can also provide the effect similar to that described in the above embodiment.

What is claimed is:

1. A method for forming a quantum well structure, comprising the step of:
   alternately growing barrier layers and well layers on a primary surface of a gallium nitride substrate which is inclined with respect to the (0001) plane so as to form the quantum well structure, wherein the inclined angle with respect to the (0001) plane is greater than 10°,
   wherein in the growing step, the well layers are each formed by growing a group III nitride semiconductor including indium and another group III element,
   the barrier layers are each grown at a first temperature,
   the well layers are each grown at a second temperature which is lower than the first temperature,
   when the well layers are each grown, a starting material gas for indium is supplied before a starting material gas for the another group III element is supplied, and
   a supplied amount of the starting material gas for the another group III element, a supplied amount of a starting material gas for a group V element, and a supply ratio of the starting material gas for the another group III element and the starting material gas for the group V element when the well layers are each grown are different from the supplied amount and the supply ratio when the barrier layers are each grown.

2. The method for forming a quantum well structure, according to claim 1, wherein before the starting material gas for the another group III element is supplied, a starting material gas for nitrogen is supplied together with the starting material gas for indium.

3. The method for forming a quantum well structure, according to claim 1, wherein when the well layers are each grown, the supply of the starting material gas for indium is started after a substrate temperature reaches the second temperature.

4. The method for forming a quantum well structure, according to claim 1, wherein the another group III element includes gallium.

5. The method for forming a quantum well structure, according to claim 4, wherein the starting material gas for indium includes trimethylindium, and the starting material gas for gallium includes trimethylgallium.

6. The method for forming a quantum well structure, according to claim 1, wherein the In composition of each of the well layers is 15% or more.

7. The method for forming a quantum well structure, according to claim 1, wherein a starting material gas for indium is supplied before a starting material gas for the another group III element is supplied, then the starting material gas for the another group III element is supplied without stopping supply of the starting material gas for indium.

8. The method for forming a quantum well structure, according to claim 1, wherein the inclined angle with respect to the (0001) plane is greater than 10° and equal to or less than 80°.

9. The method according to claim 1, wherein the starting material gas for the group V element is $NH_3$.

10. The method according to claim 1, wherein the supplied amount of starting material gas for the group V element is increased when the well layer is grown, compared to the supplied amount of starting material gas for the group V element for forming the barrier layer.

11. A method for manufacturing a semiconductor light emitting element having a light emission wavelength of 450 to 650 nm, comprising the step of:
   alternately growing barrier layers and well layers on a primary surface of a gallium nitride substrate which is inclined with respect to the (0001) plane so as to form a quantum well active layer, wherein the inclined angle with respect to the (0001) plane is greater than 10°, wherein in the growing step, the well layers are each formed by growing a group III nitride semiconductor including indium and another group III element, the barrier layers are each grown at a first temperature, the well layers are each grown at a second temperature which is lower than the first temperature, when the well layers are each grown, a starting material gas for indium is supplied before a starting material gas for the another group III element is supplied, and a supplied amount of the starting material gas for the another group III element, a supplied amount of a starting material gas for a group V element, and a supply ratio of the starting material gas for the another group III element and the starting material gas for the group V element when the well layers are each grown are different from the supplied amount and the supply ratio when the barrier layers are each grown.

12. The method for manufacturing a semiconductor light emitting element, according to claim 11, wherein before the starting material gas for the another group III element is supplied, a starting material gas for nitrogen is supplied together with the starting material gas for indium.

13. The method for manufacturing a semiconductor light emitting element, according to claim 11, wherein when the well layers are each grown, the supply of the starting material gas for indium is started after a substrate temperature reaches the second temperature.

14. The method for manufacturing a semiconductor light emitting element, according to claim 11, wherein the another group III element includes gallium.

15. The method for manufacturing a semiconductor light emitting element, according to claim 14, wherein the starting material gas for indium includes trimethylindium, and the starting material gas for gallium includes trimethylgallium.

16. The method for manufacturing a semiconductor light emitting element, according to claim 11, wherein the In composition of each of the well layers is 15% or more.

17. The method for manufacturing a semiconductor light emitting element, according to claim 11, wherein a starting material gas for indium is supplied before a starting material gas for the another group III element is supplied, then the starting material gas for the another group III element is supplied without stopping supply of the starting material gas for indium.

18. The method for forming a quantum well structure, according to claim 11, wherein the inclined angle with respect to the (0001) plane is greater than 10° and equal to or less than 80°.

19. The method according to claim 11, wherein the starting material gas for the group V element is $NH_3$.

20. The method according to claim 11, wherein the supplied amount of starting material gas for the group V element is increased when the well layer is grown, compared to the supplied amount of starting material gas for the group V element for forming the barrier layer.

* * * * *